United States Patent
Shin et al.

(10) Patent No.: US 6,803,260 B2
(45) Date of Patent: Oct. 12, 2004

(54) METHOD OF HORIZONTALLY GROWING CARBON NANOTUBES AND FIELD EFFECT TRANSISTOR USING THE CARBON NANOTUBES GROWN BY THE METHOD

(75) Inventors: Jin Koog Shin, Seoul (KR); Kyu Tae Kim, Seoul (KR); Min Jae Jung, Seoul (KR); Sang Soo Yoon, Kyounggi-do (KR); Young Soo Han, Seoul (KR); Jae Eun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/273,188

(22) Filed: Oct. 18, 2002

(65) Prior Publication Data

US 2004/0164327 A1 Aug. 26, 2004

Related U.S. Application Data

(62) Division of application No. 09/907,506, filed on Jul. 18, 2001, now Pat. No. 6,515,339.

(30) Foreign Application Priority Data

| Jul. 18, 2000 | (KR) | 2000/41012 |
| Nov. 20, 2000 | (KR) | 2000/68966 |
| Jun. 15, 2001 | (KR) | 2001/34013 |
| Jun. 28, 2001 | (KR) | 2001/37496 |

(51) Int. Cl.[7] .......................................... H01L 21/335
(52) U.S. Cl. ........................................ 438/142; 438/149
(58) Field of Search ........................................... 257/142

(56) References Cited

U.S. PATENT DOCUMENTS

| 6,256,767 B1 | 7/2001 | Kuekes et al. | 716/9 |
| 6,423,583 B1 | 7/2002 | Avouris et al. | 438/132 |
| 6,528,020 B1 * | 3/2003 | Dai et al. | 422/98 |

OTHER PUBLICATIONS

Soh et al., "Integrated nanotube circuits: Controlled growth and ohmic contacting of single-walled carbon nanotubes," Aug. 2, 1999, Applied Physics Letters, V75, N5, pp. 627–629.

Kong et al., "Synthesis of individual single-walled carbon nanotubes on patterned silicon wafers," Oct. 29, 1998, Nature, V395, pp. 878–881.

Dai et al., "Controlled Chemical Routes to Nanotube Architectures, Physics, and Devices," Dec. 7, 1999, Journal of Physics and Chemistry B, V103, pp. 11246–11255.

Tsukagoshi et al., "Coherent transport of electron spin in a ferromagnetically contacted carbon nanotube," Oct. 7, 1999, Nature V401, pp. 572–574.

Nature, V401, pp 572–574; Trans et al., Room–temperature transistor based on a single carbon nanotube, May 7, 1998, Nature, V393, pp 49–55.

* cited by examiner

Primary Examiner—Douglas Wille
(74) Attorney, Agent, or Firm—Fleshner & Kim LLP

(57) ABSTRACT

Disclosed is a method of horizontally growing carbon nanotubes, in which the carbon nanotubes can be selectively grown in a horizontal direction at specific locations of a substrate having catalyst formed thereat, so that the method can be usefully utilized in fabricating nano-devices. The method includes the steps of: (a) forming a predetermined catalyst pattern on a first substrate; (b) forming a vertical growth preventing layer on the first substrate, which prevents carbon nanotubes from growing in a vertical direction; (c) forming apertures through the vertical growth preventing layer and the first substrate to expose the catalyst pattern through the apertures; and (d) synthesizing carbon nanotubes at exposed surfaces of the catalyst pattern in order to grow the carbon nanotubes in the horizontal direction.

28 Claims, 23 Drawing Sheets

METHOD OF HORIZONTALLY GROWING CARBON NANOTUBES AND FIELD EFFECT TRANSISTOR USING THE CARBON NANOTUBES GROWN BY THE METHOD

This application is a division of application Ser. No. 09/907,506 filed Jul. 18, 2001 now U.S. Pat. No. 6,515,339.

BACKGROUND OF THE INVENTION

1. Field of the Invention

The present invention relates to a method of growing carbon nanotubes, and more particularly to a method of horizontally growing carbon nanotubes, in which the carbon nanotubes can be selectively grown in a horizontal direction at specific locations of a substrate having a catalyst formed thereat, so that the method can be usefully utilized in fabricating nano-devices.

Also, the present invention relates to a method of horizontally growing carbon nanotubes, in which catalysts are formed in a shape of nanodots or nanowires at desired specific locations, so that the carbon nanotubes are selectively grown at specific locations, thereby the method can be usefully utilized in fabricating nano-devices.

Furthermore, the present invention relates to a field effect transistor, in which carbon nanotubes are grown in a horizontal direction to form a carbon nanotube bridge achieving a field effect transistor (FET), and in which catalysts in contact with a source and a drain, between which a carbon nanotube bridge is formed, are magnetized in a desired direction, so as to simultaneously achieve both a spin valve and a single electron transistor (SET).

2. Description of the Related Art

A carbon nanotube has a construction of one-dimensional quantum wire and has good mechanical and chemical characteristics. Also, it has been known that the carbon nanotube reveals very interesting electric characteristics such as the phenomenon of quantum transport. Further, much attention has been paid to the carbon nanotube as a new material, since it has newly discovered special characteristics, in addition to the above characteristics.

In order to utilize the superior characteristics of the material, a re-executable process of fabricating the carbon nanotube has to be preceded. However, in the existing process, after the carbon nanotubes are fabricated, they are individually handled one by one to be located at a desired position. Therefore, it is difficult to apply the existing process, in which the grown carbon nanotubes are located at desired positions in "an individual handling mode", to an electronic element or a highly-integrated element, and many researches and developments are now being conducted in order to overcome this problem.

Further, in the vertical growth method, which is an existing method of synthesizing the carbon nanotubes, carbon nanotubes 6 (see FIG. 1) are grown in the vertical direction in a shape of a well-arranged barley field on a substrate 2, on which a pattern of catalyst is formed. Regarding the vertical growth method, a large quantity of report already exists.

However, in order to utilize the carbon nanotube as a nano-device having a new function, a technique capable of selectively growing the carbon nanotubes in the horizontal direction at specific positions is more useful and more highly required than the vertical growth technique, in a viewpoint of appliance.

The first report, which illustrates that carbon nanotubes can be horizontally grown between patterned metals to be connected with each other, was made by Hong Jie Die as shown in FIG. 2 (see Nature, vol. 395, page 878). FIG. 2 is a view for schematically showing the method of horizontally growing carbon nanotubes reported by Hong Jie Die. However, FIG. 2 apparently shows that a great many carbon nanotubes are grown not only in the horizontal direction but also in the vertical direction. This is because the carbon nanotubes are grown from surfaces of catalyst metal and moreover are randomly grown at all exposed surfaces of the catalyst.

In addition, since an effect of giant magneto resistance (GMR) was discovered in a multi-layer film comprising magnetic metal and non- magnetic metal in 1988, a research about a magnetic metal thin film is being widely conducted around the world. Moreover, since electrons exist in a spin-polarized state in the magnetic metal, polarized spin current can be generated by utilizing this characteristic. Therefore, a great effort has been made to understand and to develop the spin electronics (spintronics) or the magneto electronics by utilizing the degree of freedom of spin which is an important inherent characteristic of the electron.

Recently, such phenomena as tunneling magneto resistance (TMR) and giant magneto resistance (GMR) discovered in the magnetic multi-layer film system of nano-structure have already been applied in a magneto resistance (MR) magnetic head element and placed in a hard disc drive (HDD) of a computer to be commercialized.

In this case, TMR means a phenomenon, in which the tunneling current changes according to the relative magnetized direction of a ferromagnetic material in a junction having a construction of ferromagnet/dielectric (semiconductor)/ferromagnet, and which has a larger magnetic resistance ratio and a larger field sensitivity than other magnetic resistance, so that a research for utilizing it in a material for magnetic random access memory (MRAM) or magnetic resistance head of next generation has been actively performed. However, a re-executable formation of dielectric layer and reduction of junction resistance become serious problems.

Currently, a large number of scientists in the field of magnetic application are actively conducting researches in manufacturing MRAMS, utilizing a magnetic tunneling junction (MTJ) and a spin valve showing the phenomenon of magnetic resistance in the low magnetic field.

SUMMARY OF THE INVENTION

Accordingly, the present invention has been made in an effort to solve the aforementioned problems, and it is an object of the present invention to provide a method of horizontally growing carbon nanotubes, in which the carbon nanotubes can be selectively grown in a horizontal direction at specific locations of a substrate having catalyst formed thereat, so that the method can be usefully utilized in fabricating nano-devices.

Still, it is another object of the present invention to provide a method of horizontally growing carbon nanotubes, in which catalysts are formed in a shape of nanodots or nanowires at desired specific locations, so that the carbon nanotubes are selectively grown at specific locations, so that the method can be usefully utilized in fabricating nano-devices.

Still, it is another object of the present invention to provide a field effect transistor, in which carbon nanotubes are grown in a horizontal direction to form a carbon nanotube bridge, so as to achieve a field effect transistor (FET), and in which catalysts in contact with a source and a drain, between which a carbon nanotube bridge is formed, are magnetized in a desired direction, so as to simultaneously achieve both a spin valve and a single electron transistor (SET).

In accordance with one aspect, the present invention provides a method of horizontally growing carbon nanotubes, the method comprising the steps of: (a) forming a predetermined catalyst pattern on a first substrate; (b) forming a vertical growth preventing layer on the first substrate, which prevents carbon nanotubes from growing in a vertical direction; (c) forming apertures through the vertical growth preventing layer and the first substrate to expose the catalyst pattern through the apertures; and (d) synthesizing carbon nanotubes at exposed surfaces of the catalyst pattern, so as to grow the carbon nanotubes in the horizontal direction.

In this case, the apertures formed in the step c are of a hole-type, in which the apertures extend entirely through the vertical growth preventing layer and the first substrate, or a well-type, in which the first substrate is partially etched, so that the apertures extend through the vertical growth preventing layer and a portion of the first substrate.

In accordance with another aspect, the present invention provides a method of horizontally growing carbon nanotubes, the method comprising the steps of: (i) forming masks at predetermined locations on a first substrate; (j) forming a catalyst pattern on the first substrate and the masks formed on the first substrate; (k) forming a vertical growth preventing layer on the first substrate, which prevents the carbon nanotubes from growing in a vertical direction; (l) eliminating the masks from the vertical growth preventing layer and the first substrate, so as to form apertures and expose the catalyst pattern; and (m) synthesizing the carbon nanotubes at exposed locations of the catalyst pattern, so as to grow the carbon nanotubes in the horizontal direction.

In accordance with another aspect, the present invention provides a method of horizontally growing carbon nanotubes, the method comprising the steps of: forming a catalyst pattern in a predetermined two-dimensional arrangement on a first substrate; fabricating a second substrate for preventing vertical growth of the carbon nanotubes having holes in a predetermined arrangement; placing the second substrate for preventing vertical growth of the carbon nanotubes over the first substrate having the catalyst pattern with a predetermined gap; and synthesizing the carbon nanotubes at the catalyst pattern, so as to horizontally grow the carbon nanotubes.

In accordance with another aspect, the present invention also provides a method of horizontally growing carbon nanotubes, the method comprising the steps of: forming a catalyst in a shape of nanodots or nanowires on a substrate; patterning a growth preventing layer on the catalyst in the shape of nanodots or nanowires, so as to prevent the nanodots or nanowires from growing in a vertical direction; and selectively growing the carbon nanotubes in a horizontal direction at the nanodots or nanowires.

In this case, the catalyst in the shape of the nanodots or nanowires are patterned by an imprint method or a self-assembly method.

Further, the growth preventing layer may be formed of an insulator film made from a compound selected from the group consisting of silicon nitride (SiN) and silicon oxide ($Sio_2$), or may be formed from a metal selected from the group consisting of Palladium (Pd), Niobium (Nb), and Molybdenum (Mo).

In accordance with another aspect, the present invention also provides a method of horizontally growing carbon nanotubes, the method comprising the steps of: forming catalysts in a shape of nanowires on a substrate; forming a growth preventing layer on the catalysts having the shape of nanowires by a semiconductor process including a lithography process, the growth preventing layer being spaced from the substrate with a predetermined gap; eliminating a portion of the catalysts having the shape of nanowires in an area at which the growth preventing layer is not formed, by means of a wet etching; and growing the carbon nanotubes in a horizontal direction between the catalysts formed under the growth preventing layer spaced from the substrate with a predetermined gap, by means of a chemical vapor deposition method.

Furthermore, in accordance with another aspect, the present invention also provides a field effect transistor comprising a source, a drain, and a carbon nanotube bridge between the source and the drain, the carbon nanotube bridge being formed by carbon nanotubes grown in a horizontal direction between the source and the drain, so that the field effect transistor can control a flow of electrons.

In this case, the carbon nanotube bridge formed between the source and the drain comprises carbon nanotubes having a characteristic of semiconductor.

Moreover, on the carbon nanotube bridge formed between the source and the drain, a plurality of gate carbon nanotubes are formed intersecting the carbon nanotube bridge between the source and the drain at, so as to produce an energy barrier to form a quantum point and to control the flow of the electric current.

Also, the quantum point has a size, which is controlled by using a common terminal, when the gate carbon nanotube bridges form gates.

Furthermore, the field effect transistor also comprises first and second wires, through which electric current can pass, and which are provided on the source and the drain, so as to magnetize catalysts being in contact with the source and the drain in a desired direction. The first wire disposed on the source and the second wire disposed on the drain are arranged in parallel with each other.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

The above and other objects, characteristics, and advantages of the present invention will be apparent from the following description along with the accompanying drawings.

Figure 1:
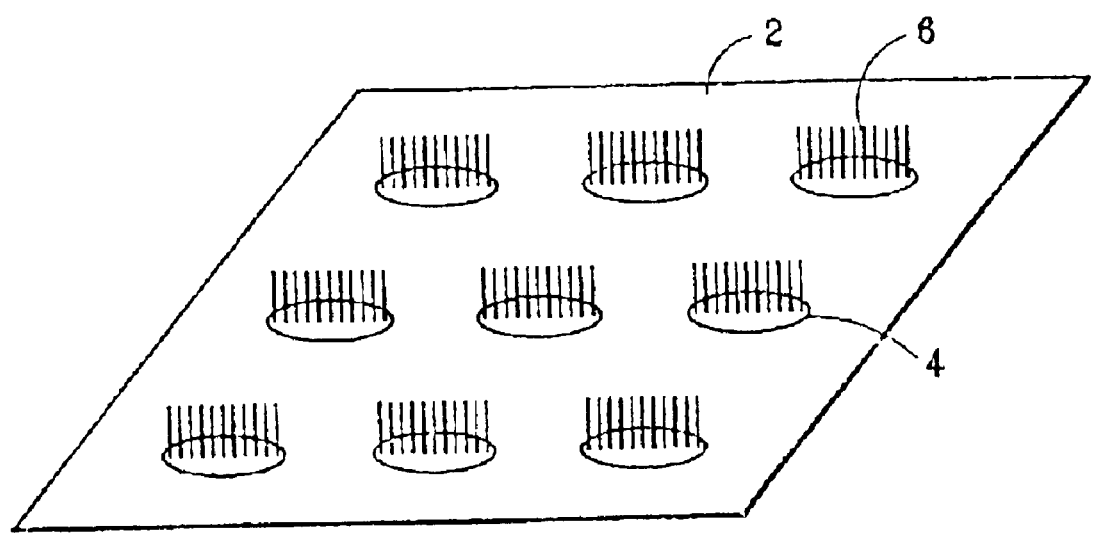
FIG. 1 is a view for schematically showing a conventional method of vertically growing carbon nanotubes.
Figure 2:
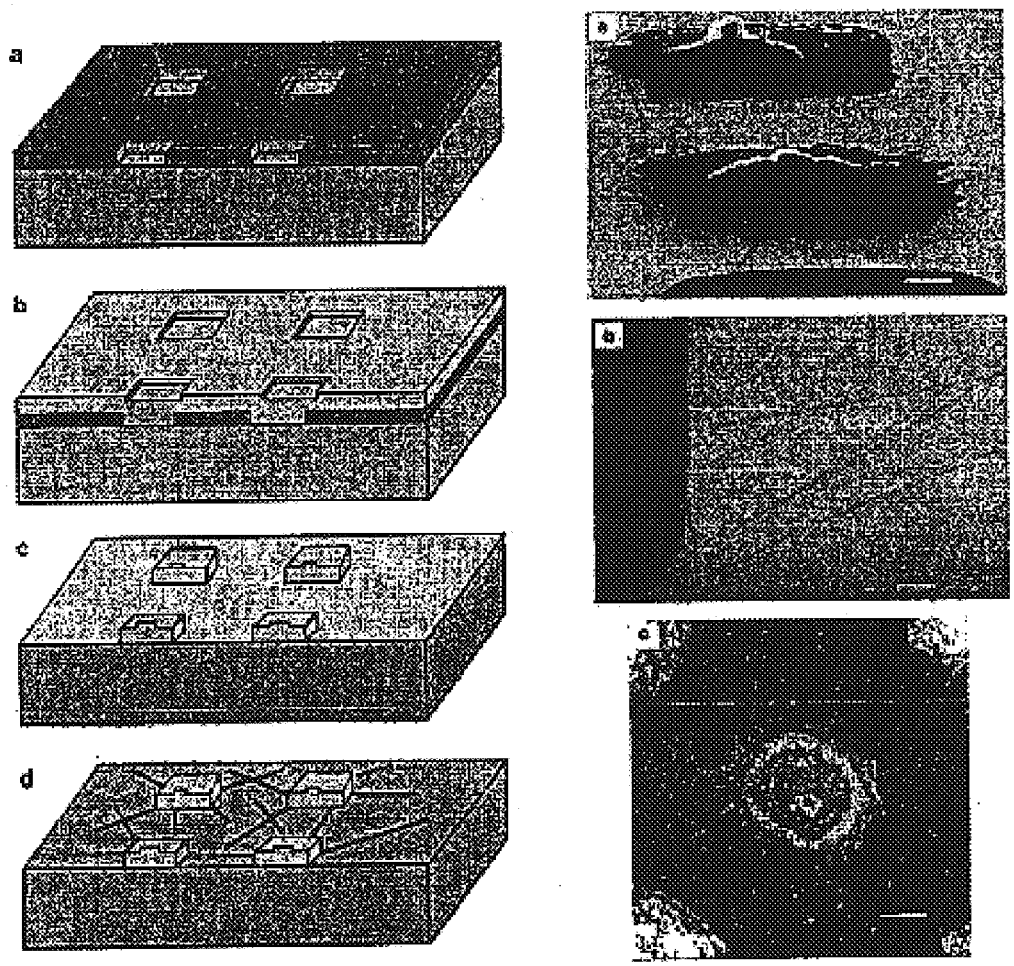
FIG. 2 a view for schematically showing another conventional method of horizontally growing carbon nanotubes, which has been disclosed by Horg Jie Die.
Figure 3A:
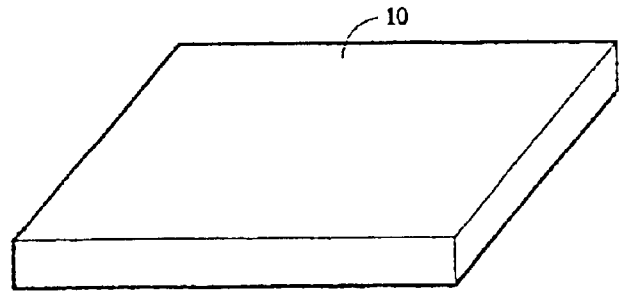
FIGS. 3A to 3D are views for showing a method of horizontally growing carbon nanotubes according to one embodiment of the present invention.
Figure 3B:
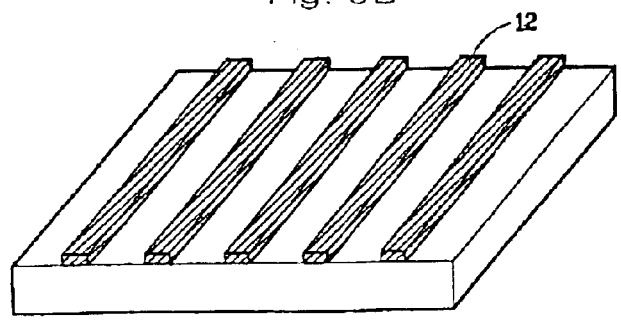
Figure 3C:
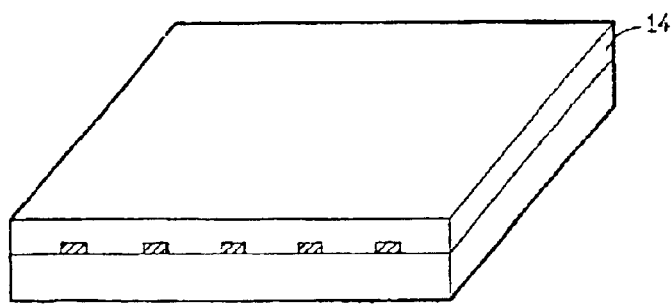
Figure 3D:
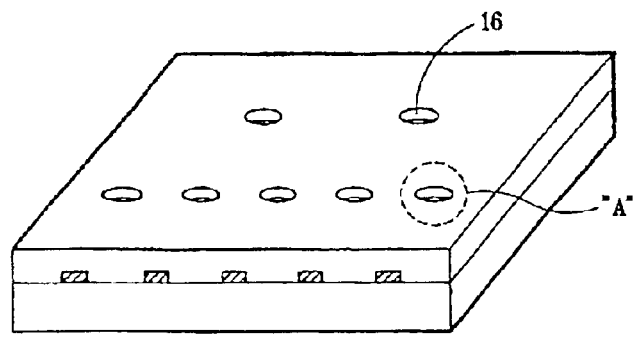
Figure 4:
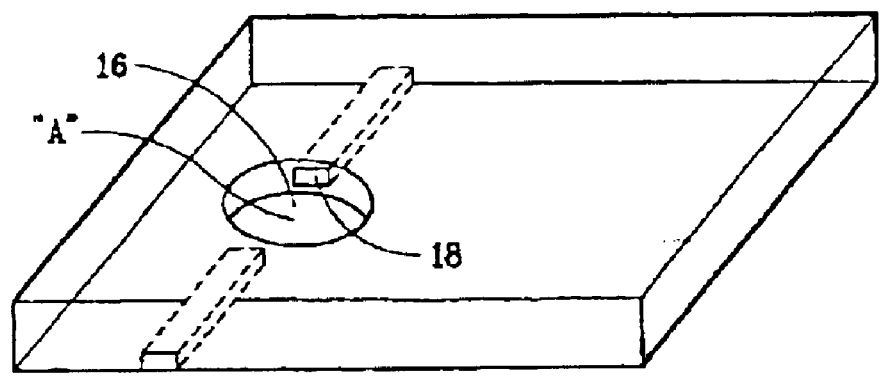
FIG. 4 is a perspective view of an object fabricated by the method shown in FIGS. 3A. to 3D.

FIGS. 3A to 3D are views for showing a method of horizontally growing carbon nanotubes according to one embodiment of the present invention, and FIG. 4 is a perspective view of an object fabricated by the method shown in FIGS. 3A to 3D.

Referring to FIGS. 3A to 4, the method of horizontally growing carbon nanotubes according to the present invention includes the steps of: (a) forming a predetermined catalyst pattern 12 on a first substrate 10; (b) forming a vertical growth preventing layer 14 on the first substrate 10, which prevents carbon nanotubes from growing in a vertical direction; (c) forming apertures 16 through the vertical growth preventing layer 14 and the first substrate 10 to expose the catalyst pattern 12 through the apertures 16; and (d) synthesizing carbon nanotubes at exposed surfaces 18 of the catalyst pattern 12, so as to grow the carbon nanotubes in the horizontal direction.

Various materials such as silicon, glass, silicon oxide, glass coated with indium tin oxide (ITO) may be employed as the first substrate 10 and the vertical growth preventing layer 14 depending on objects.

As for the above-mentioned catalyst, all kinds of materials, at which the carbon nanotubes can grow, including metal, metal alloy, superconducting metal, and other special metal, may be utilized. Also, those materials may be formed to be the predetermined pattern 12 by such processes as lithography, sputtering, and evaporation.

In this case, the apertures 16 located at specific positions of the catalyst pattern may be formed by such methods as laser drilling, wet etching, and dry etching. Meanwhile, in a more detailed description, the apertures 16 may be a hole type, in which the apertures 16 extend through the vertical growth preventing layer 14 and the first substrate 10 as shown in FIG. 5A, or a well type, in which a portion of the first is substrate 10 is not etched but remains so that each of the apertures 16 does not extend entirely through the vertical growth preventing layer 14 and the first substrate 10 as shown in FIG. 5B.

Figure 5A:
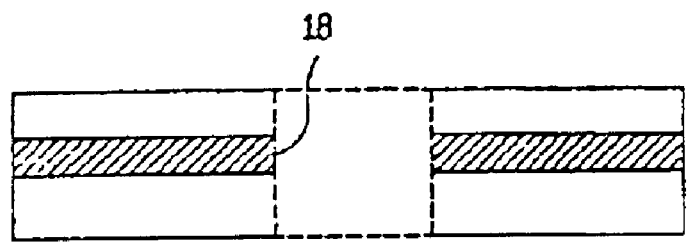
FIG. 5A or FIG. 5B are sectional views, which respectively show a hole type, in which apertures extend through a vertical growth preventing layer and a first substrate, and a well type, in which a portion of the first substrate is not etched but remains so that each of the apertures does not extend entirely through the vertical growth preventing layer and the first substrate.
Figure 5B:
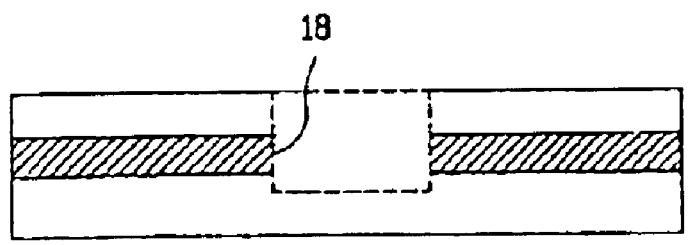

Then, the object as shown in FIG. 5A or FIG. 5B, which is prepared through the above process, is put in an apparatus for synthesizing carbon nanotubes and is synthesized, so that each carbon nanotube grows only at the exposed surfaces 18 of the catalyst pattern, which is exposed to a source gas. That is, the carbon nanotubes grow only in a horizontal direction, which is parallel to the first substrate 10.

In this case, such methods as a catalyst thermal decomposition method, a plasma vapor deposition method, and a hot-filament vapor deposition method can be utilized in synthesizing the carbon nanotubes. Further, a compound of hydrocarbon such as methane, acetylene, carbon monoxide, benzene, and ethylene can be used as a raw material.

Figure 6A:
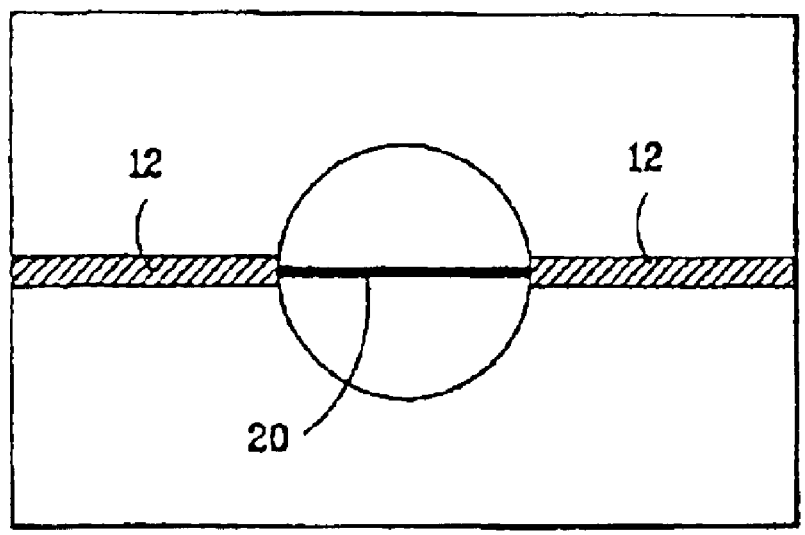
FIGS. 6A to 11 are views for showing various shapes of carbon nanotubes, which have been horizontally grown by the method of horizontally growing carbon nanotubes according to the present invention.
Figure 6B:
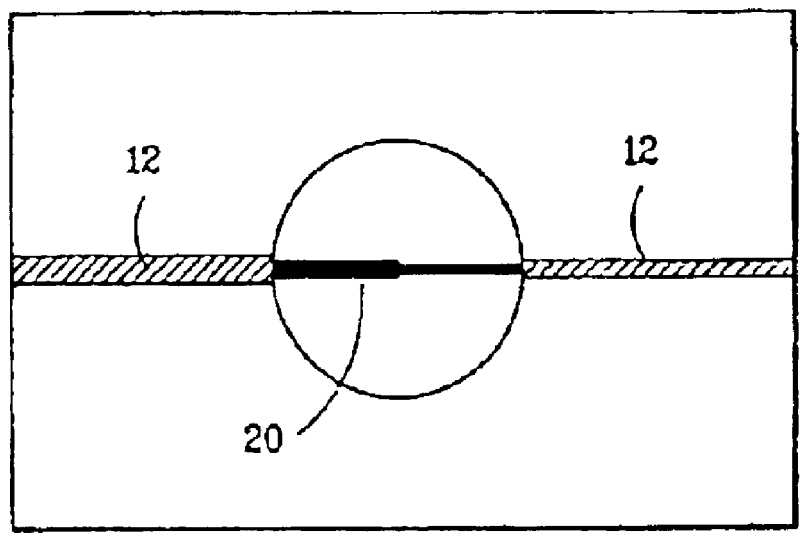
Figure 11:
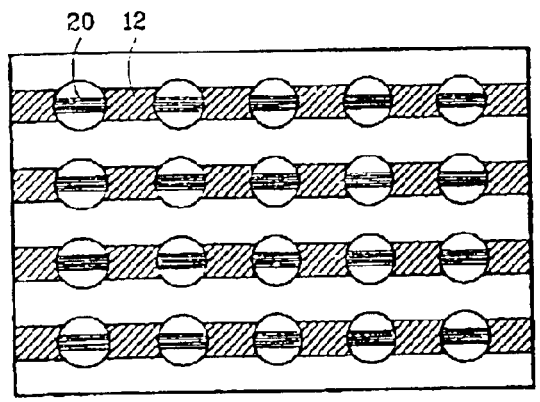

In the meantime, FIGS. 6A, 6B and 11 illustrate various shapes of carbon nanotubes, which are horizontally grown by the method of horizontally growing carbon nanotubes according to the present invention.

FIGS. 6A and 6B show a carbon nanotube 20, which is grown at a straight-line-type catalyst pattern 12, and in which the aperture is formed at a predetermined portion of the catalyst pattern. In this case, by properly controlling the synthesizing time, optionally obtained can be a carbon nanotube 20 of a bridge construction, in which the exposed surfaces 18 of the catalyst pattern opposed to each other are connected with each other through the carbon nanotube, or a carbon nanotube of a free-hang construction, in which the opposed exposed surfaces 18 are not connected with each other.

In the meantime, the diameter of the grown carbon nanotube 20 can be determined by controlling the area or the size of the particles of the exposed catalyst surface, and the exposed catalyst surface can have various surface states by changing the condition of forming the pattern or through a subsequent treatment such as a plasma treatment and an acid treatment. Therefore, through the process as described above, at least two carbon nanotubes 20 may be grown at a single exposed surface, and the carbon nanotubes 20 grown at the opposed exposed surfaces 18 of the catalyst pattern may have different constructions, that is, different diameters, different chiralitys, etc., as shown in FIG. 6B.

FIGS. 7A to 7D respectively show a carbon nanotube horizontally grown on an intersection-type catalyst pattern, in which the apertures are formed on the intersection area of the catalyst pattern.

Likewise in the straight-line-type catalyst pattern, a carbon nanotube 20 of the bridge construction as shown in FIG.

Figure 7A:
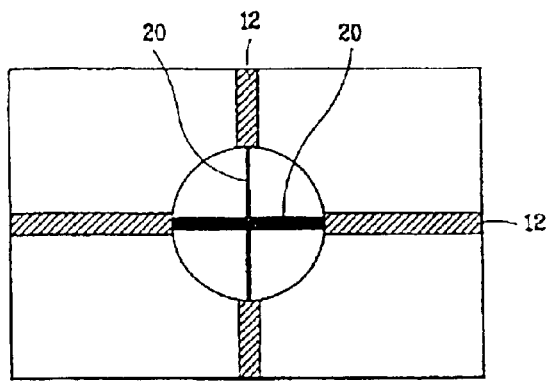
Figure 7B:
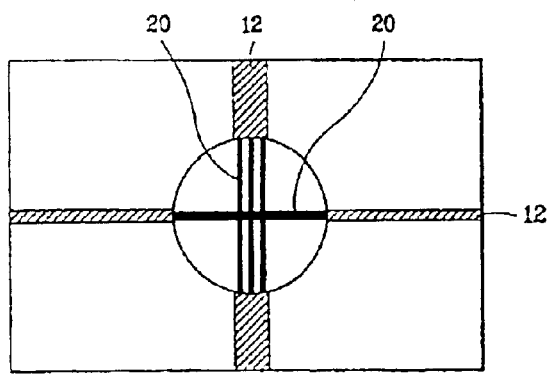
Figure 7C:
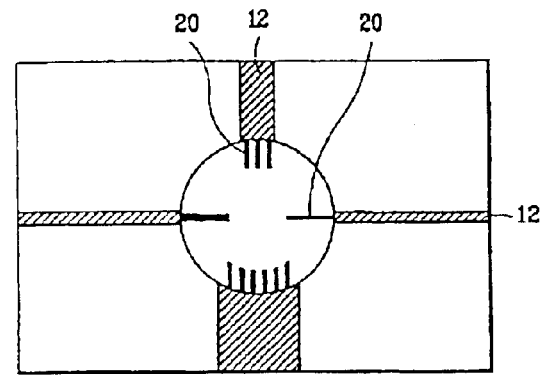
Figure 7D:
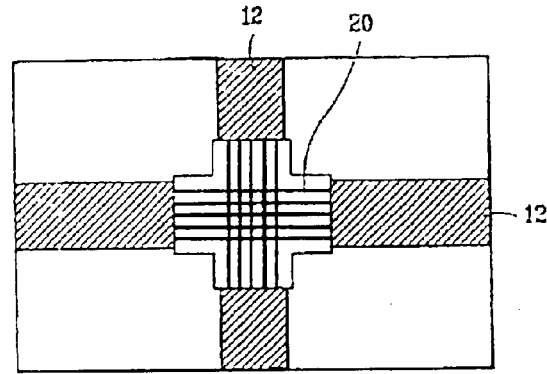
Figure 8:
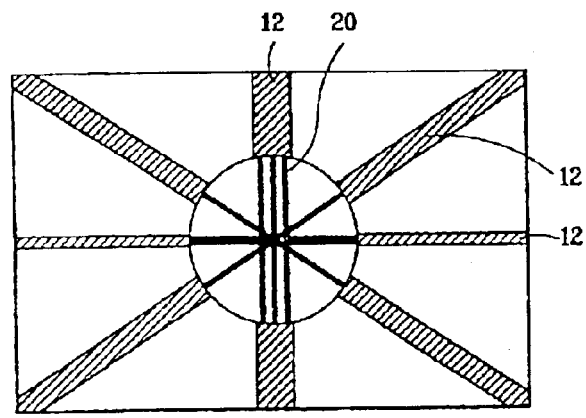
Figure 9:
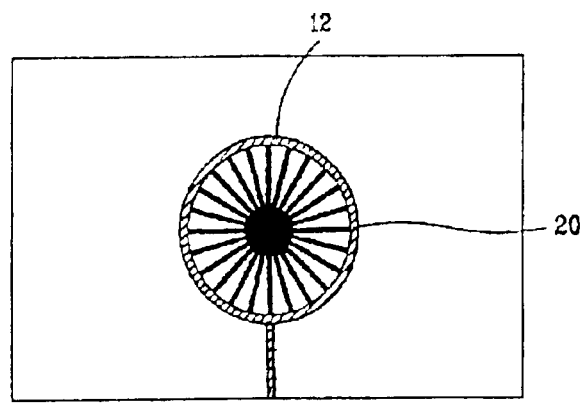
Figure 10:
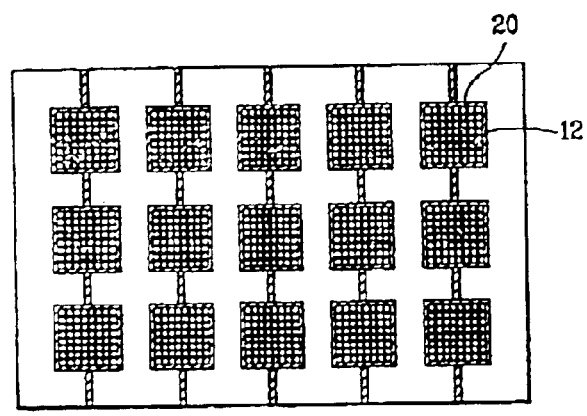

7A or a carbon nanotube 20 of the free-hang construction as shown in FIG. 7C may be obtained also in this intersection-type catalyst pattern. Further, the carbon nanotubes 20 grown at the exposed surfaces of the catalyst pattern opposed to each other may have different diameters from each other as shown in FIG. 7C, and at least two carbon nanotubes 20 may be grown at one exposed surface as shown in FIG. 7B. Also, by growing a plurality of carbon nanotubes at each of the exposed surfaces of catalyst pattern, the grown carbon nanotubes may have a mesh shape as shown in FIG. 7D.

Moreover, as shown in FIG. 7A, by controlling the height of the catalyst pattern in the vertical direction and in the horizontal direction, carbon nanotubes 20 can be grown while intersecting with each other, and this can be utilized as a gate element. Further, the carbon nanotubes grown while intersecting with each other may be in mechanical contact with each other, so as to form an electric junction, which can be directly utilized in the junction analysis, and this junction characteristic may be utilized by elements.

In this case, as a method for facilitating the formation of the junction, thermal expansion/contraction of material may be utilized. Since the synthesis of the carbon nanotubes is usually carried out at a temperature between 500°C. and 900°C., the contact between the carbon nanotubes 20 grown intersecting can be facilitated by utilizing a phenomenon of the thermal contraction, which happens in a cooling stage after the synthesis.

FIGS. 8, 9, 10, and 11 respectively show a carbon nanotube horizontally grown at a radial catalyst pattern, a circular catalyst pattern, a rectangular catalyst pattern, and a construction having at least two grooves arranged on at least two catalyst patterns of straight-line-type, respectively in which the apertures are formed at intersecting areas, an interior of the circle, and an interior of the rectangle of the pattern.

FIGS. 6A to 11 show various shapes of the carbon nanotubes horizontally grown according to the present invention, which does not limit the scope of the invention but the catalyst pattern may be modified in a more efficient way in being applied to the nano-devices.

Figure 12A:
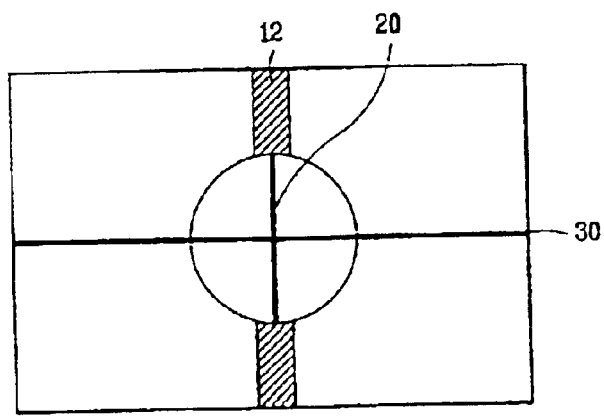
FIGS. 12A and 12B are views for showing constructions, in which a metal is patterned to make a junction or junctions with the carbon nanotubes horizontally grown by the method of horizontally growing carbon nanotubes according to the present invention.
Figure 12B:
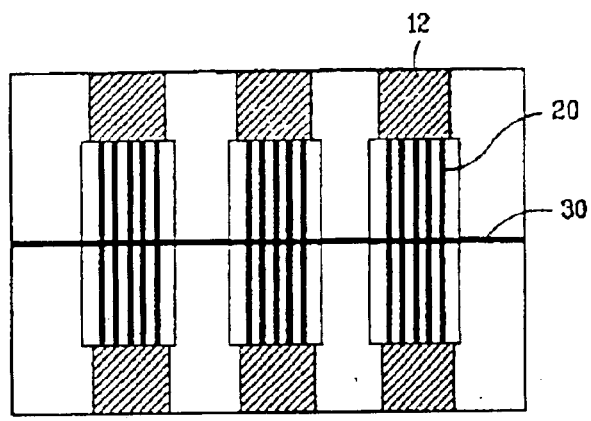
Figure 13A:
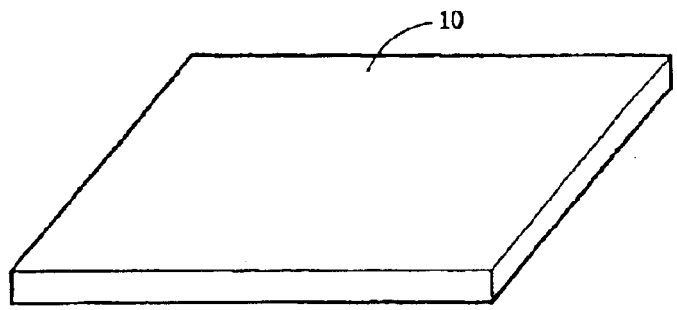
FIGS. 13A to 13D are views for schematically showing another method of horizontally growing carbon nanotubes according to another embodiment of the present invention.
Figure 13B:
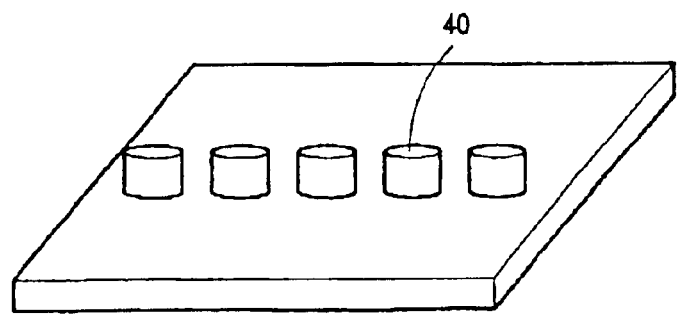
Figure 13C:
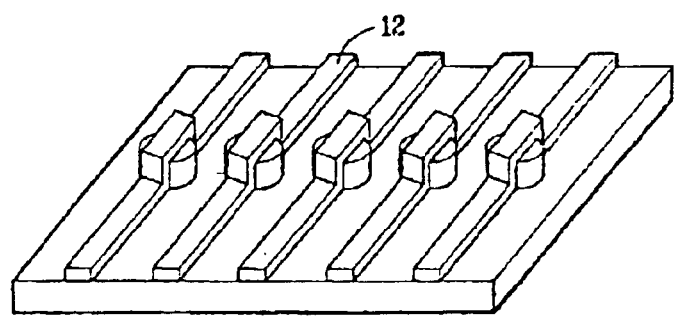
Figure 13D:
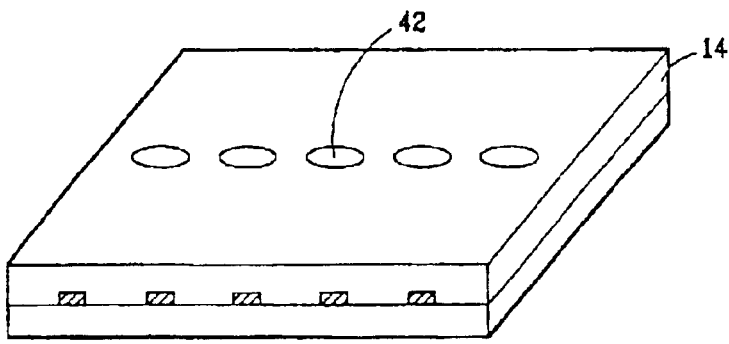

Meanwhile, FIGS. 12A and 12B show constructions, in which a metal 30 is patterned to make a junction or junctions with the carbon nanotubes 20 horizontally grown by the method of horizontally growing carbon nanotubes according to the present invention. Consequently, the junction between the carbon nanotubes 20 and the metal 30 can be easily achieved, and such junction can be optionally formed at a specific location.

Further, by utilizing the above-mentioned method, a carbon nanotube/carbon nanotube junction, a carbon nanotube/metal junction, and a carbon nanotube/semiconductor junction can be optionally formed at desired locations.

Meanwhile, FIGS. 13A to 13D are views for schematically showing another method of horizontally growing carbon nanotubes according to another embodiment of the present invention.

Referring to FIGS. 13A to 13D, the method of horizontally growing carbon nanotubes according to another embodiment of the present invention includes the steps of: (i) forming masks 40 at predetermined locations on a first substrate 10; (j) forming the catalyst pattern 12 on the first substrate 10 and the masks 40 formed on the first substrate 10; (k) forming a vertical growth preventing layer 14 on the first substrate 10, which prevents carbon nanotubes from growing in a vertical direction; (l) eliminating the masks 40 from the vertical growth preventing layer 14 and the first substrate 10, so as to form apertures 42 and expose the catalyst pattern 12; and (m) synthesizing carbon nanotubes at the exposed locations of the catalyst pattern, so as to grow the carbon nanotubes in the horizontal direction.

In the present embodiment, the material of the first substrate 10 and the catalyst pattern 12, the method of forming the catalyst pattern, and the method of synthesizing the carbon nanotubes are the same as those in the first embodiment. Further, the masks 40, which can be easily eliminated by etching, heating, etc., are formed on the substrate by such a method as evaporation. Further, the catalyst pattern may be formed in various shapes including a straight-line shape, an intersection shape, a radial, shape, a circular shape, and a rectangular shape. Also by the present embodiment, the carbon nanotubes grown in the horizontal direction as shown in FIGS. 6A to 11 can be obtained.

Figure 14A:
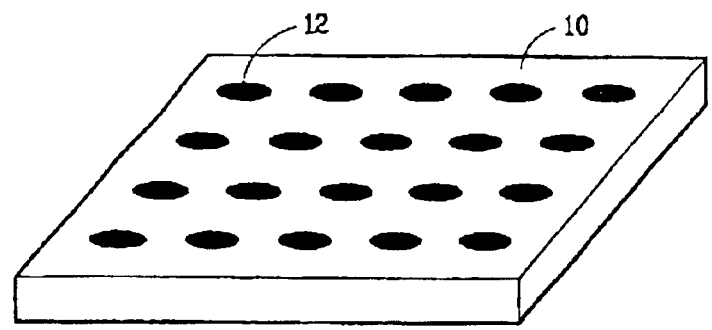
FIGS. 14A to 14C are views for schematically showing another method of horizontally growing carbon nanotubes according to another embodiment of the present invention.
Figure 14B:
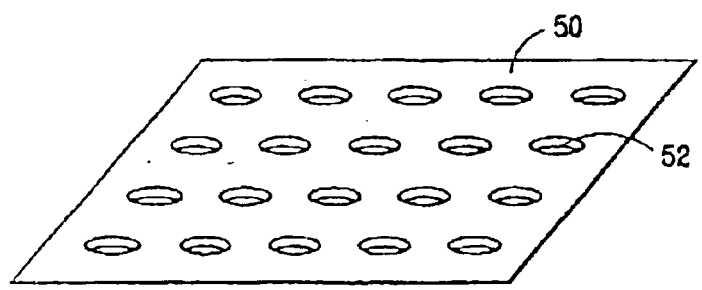
Figure 14C:
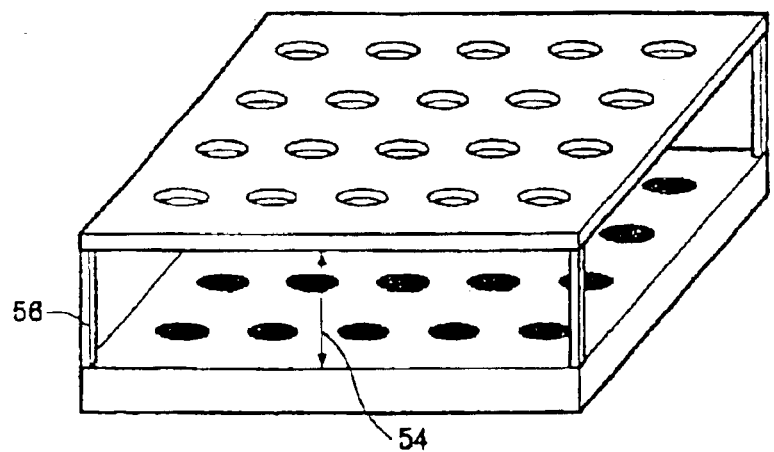

FIGS. 14A to 14C are views for schematically showing another method of horizontally growing carbon nanotubes according to another embodiment of the present invention.

Referring to FIGS. 14A to 14C, the method of horizontally growing carbon nanotubes according to the present embodiment of the invention includes the steps of: forming a catalyst pattern 12 in a predetermined two-dimensional arrangement on the first substrate 10; fabricating a separate substrate 50 for preventing vertical growth of the carbon nanotubes having holes 52 in a predetermined arrangement; placing the vertical growth preventing substrate 50 over the first substrate 10 having the catalyst pattern 12 with a predetermined gap 54; and synthesizing the carbon nanotubes at the catalyst pattern 12 so as to horizontally grow the carbon nanotubes.

In this case, the kinds of the first substrate 10 and the catalyst pattern 12, the method of forming the catalyst pattern, and the method of syntnesizing the carbon nanotubes in the present embodiment are the same as those in the first embodiment. Further, the holes 52 of the second substrate 50 for preventing vertical growth of the carbon nanotubes may be formed by such methods as laser drilling, wet etching, and dry etching. In the step of placing the vertical growth preventing substrate 50 over the first substrate 10, a space in which the carbon nanotubes can grow will do for the predetermined gap 54 between the two substrates; 10 and 50, and spacers 56 can be disposed between the corners of the first and the second substrates 10 and 50, so as to maintain the gap therebetween.

Figure 15A:
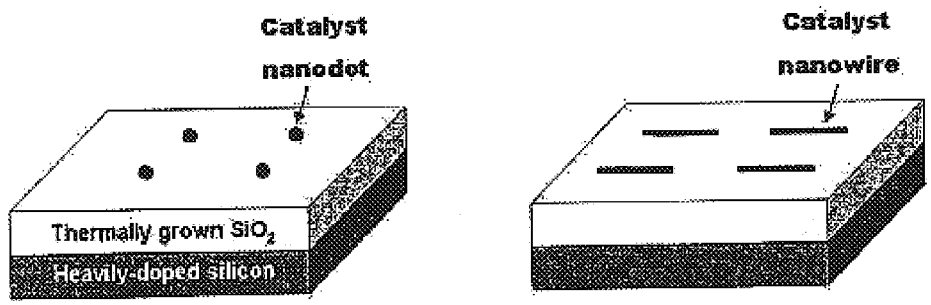
FIGS. 15A to 15C are views for schematically showing a process of horizontally growing the carbon nanotubes at desired locations by the method of horizontally growing the carbon nanotubes according to the present invention.
Figure 15B:
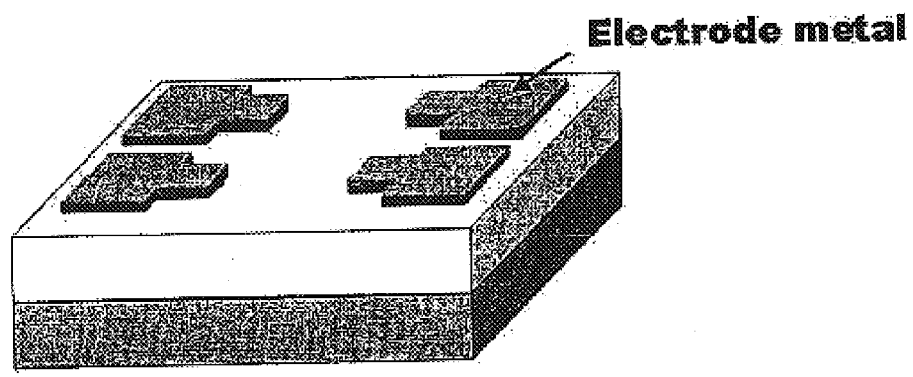
Figure 15C:
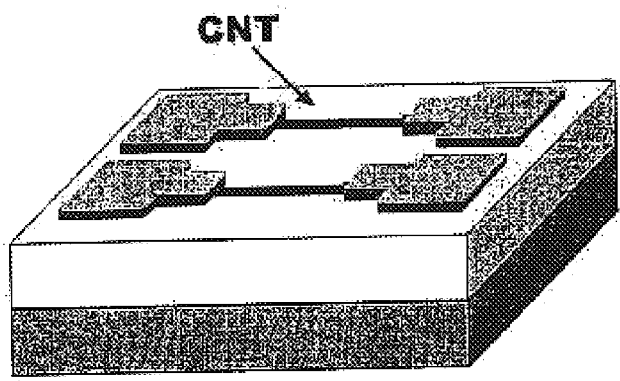

Meanwhile, FIGS. 15A to 15C are schematic views for showing a process of horizontally growing the carbon nanotubes at desired locations by means of a catalyst having a shape of nanodots or nanowires, in the method of horizontally growing the carbon nanotubes according to the present invention.

First, referring to FIG. 15A, catalyst metal patterned in a shape of nanodots or nanowires is deposited on a silicon substrate having an oxide film formed thereon. In this case, the same material as the catalyst pattern 12 as described above is usually used as the catalyst metal.

Further, as shown in FIG. 15B, such material as Palladium (Pd), Niobium (Nb), Molybdenum (Mo), or an insulator of silicon nitride (SiN) film or silicon oxide ($SiO_2$) film is deposited to form a growth preventing layer on the nanodots or the nanowires. This layer functions to prevent the carbon nanotubes from growing in the vertical direction from the catalyst, and further functions as an electrode in the case of the metal. In this case, the growth preventing layer can be patterned in a desired shape by such a general semiconductor process as a photo resist process (PR process) and a lithography process.

Accordingly, as shown in FIG. 15C, on the substrate having a growth preventing layer formed in a pattern, the carbon nanotubes can be grown in the horizontal direction from the catalyst by means of a chemical vapor deposition method.

FIGS. 16A to 17D are views for showing a method of selectively growing carbon nanotubes in a horizontal direction, in which the catalyst metal is formed in a shape of nanowires and the location for forming the catalyst can be controlled by wet etching.

Figure 16A:
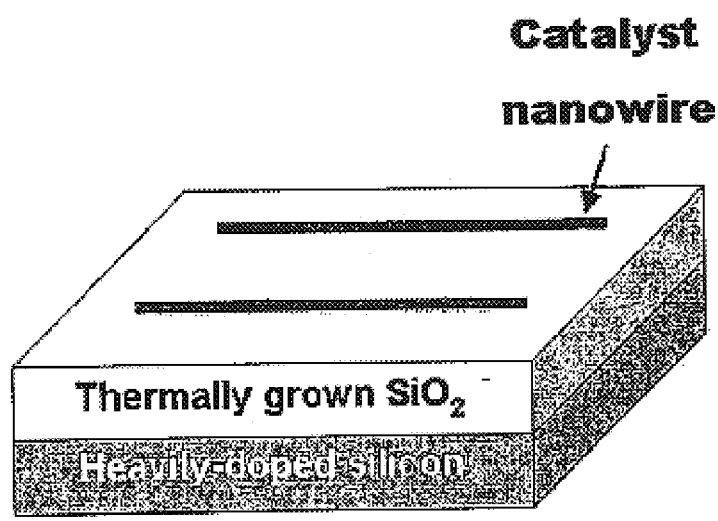
FIGS. 16A to 17D are views for showing a method of selectively growing carbon nanotubes in a horizontal direction, in which the catalyst metal is formed in a shape of nanowires and the location for forming the catalyst can be controlled by wet etching.
Figure 17A:
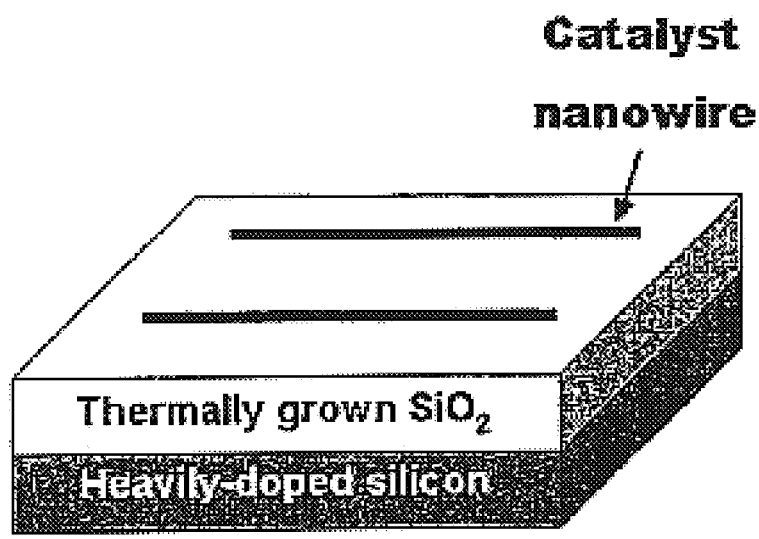

First, as shown in FIGS. 16A and 17A, catalyst metal patterned in a shape of nanowires is deposited on a silicon substrate having an oxide film formed thereon. In this case, the same material as the catalyst pattern 12 as described above is usually used as the catalyst metal.

Figure 16B:
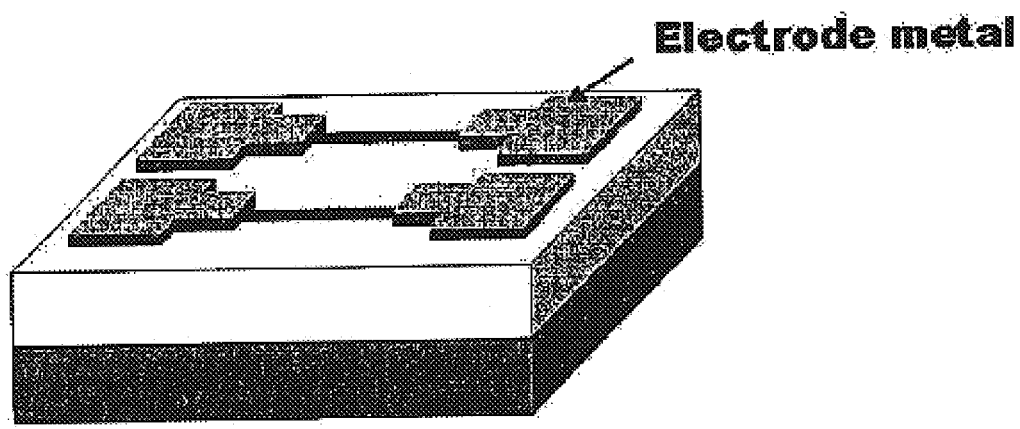
Figure 17B:
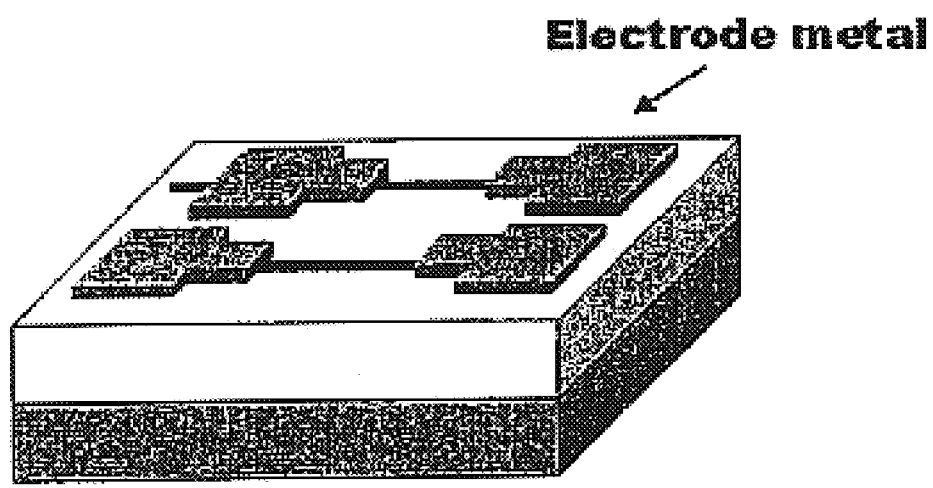

Further, as shown in FIGS. 16B and 17B, such material as Palladium (Pd), Niobium (Nb), Molybdenum (Mo), or an insulator of silicon nitride (SiN) film or silicon oxide ($SiO_2$) film is deposited to form a growth preventing layer on the catalyst in the shape of the nanodots or the nanowires with a predetermined gap therebetween. This layer functions to prevent the carbon nanotubes from growing in the vertical direction from the catalyst, and further functions as an electrode in the case of the metal.

The growth preventing layer can be patterned in a desired shape by such a general semiconductor process as a photo resist process and a lithography process. In this case, FIG. 17B shows the case, in which an error happens in the course of forming the pattern, that is, the case, in which the catalyst is exposed at an undesired area in the course of patterning the growth preventing layer.

Figure 16C:
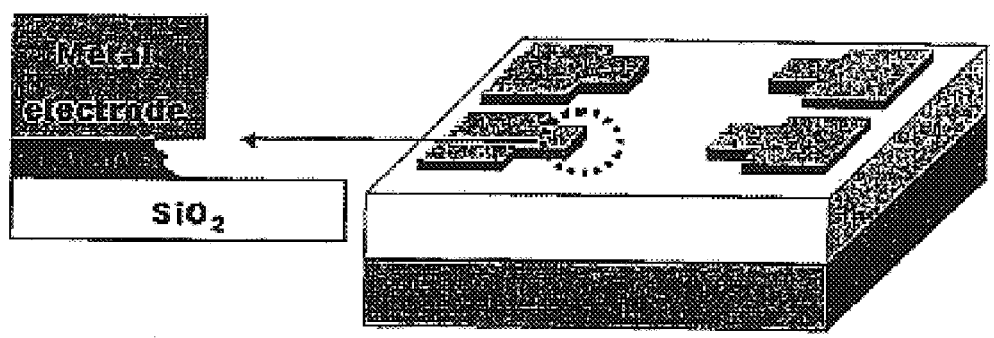
Figure 16D:
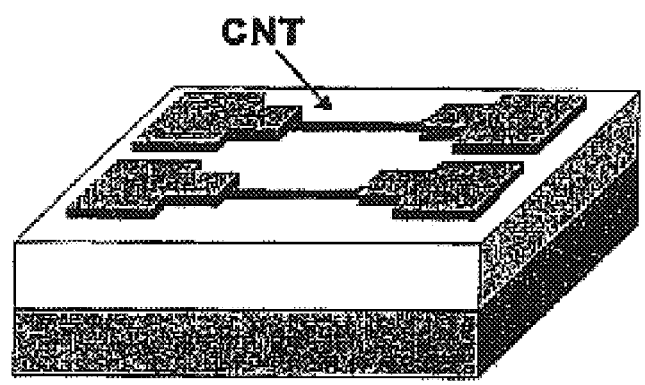
Figure 17C:
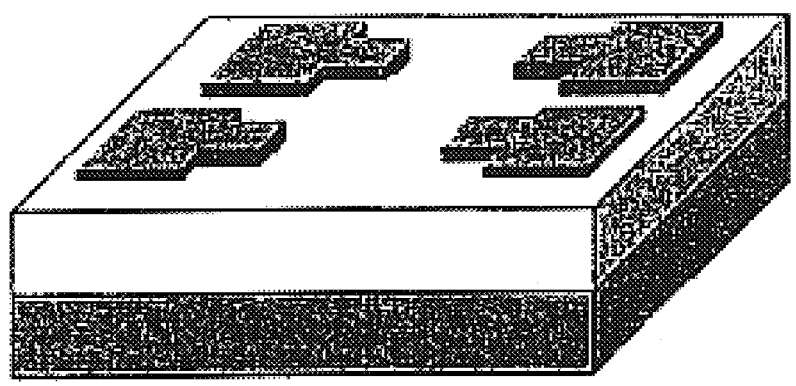
Figure 17D:
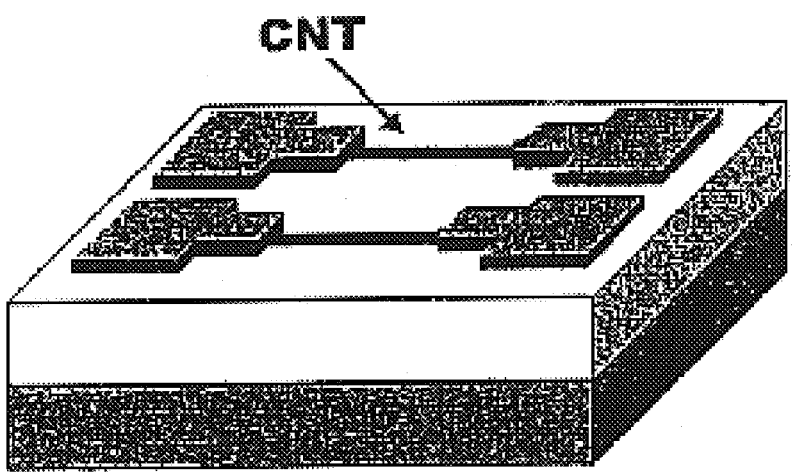

Moreover, as shown in FIGS. 16C and 17C, the catalyst having the shape of nanowires in an area, in which the growth preventing layer is not formed, that is, the catalyst in an undesired area, is eliminated by means of wet etching. In this case, in the case of carrying out the wet etching, since an isotropic etching is carried out, the catalyst metal is further etched inward of the growth preventing layer (see FIG. 16C), so that the function of the growth preventing layer, which means to prevent the carbon nanotubes from growing in the vertical direction, becomes more important.

Further, in the case where the catalyst is formed in the shape of nanowires, even when an excessive etching has been carried out, the catalyst, from which the carbon nanotubes can be grown, remains on the substrate, so as to form a more efficient growth preventing layer, differently from the case of the catalyst in the shape of the nanodots. Further, as shown in FIGS. 17B and 17C, even when the pattern of the growth preventing layer is erroneously formed in the lithography process, the error generated in the lithography process can be settled by means of the wet etching.

Therefore, by means of the chemical vapor deposition method, the carbon nanotubes can be horizontally grown between the catalysts formed under the growth preventing layer spaced therefrom with a predetermined gap.

Meanwhile, in the embodiments shown in FIGS. 15A to 17D, the following methods already known in public may be utilized as the method of forming the catalyst pattern on the substrate in the shape of nanodots or nanowires.

Figure 18A:
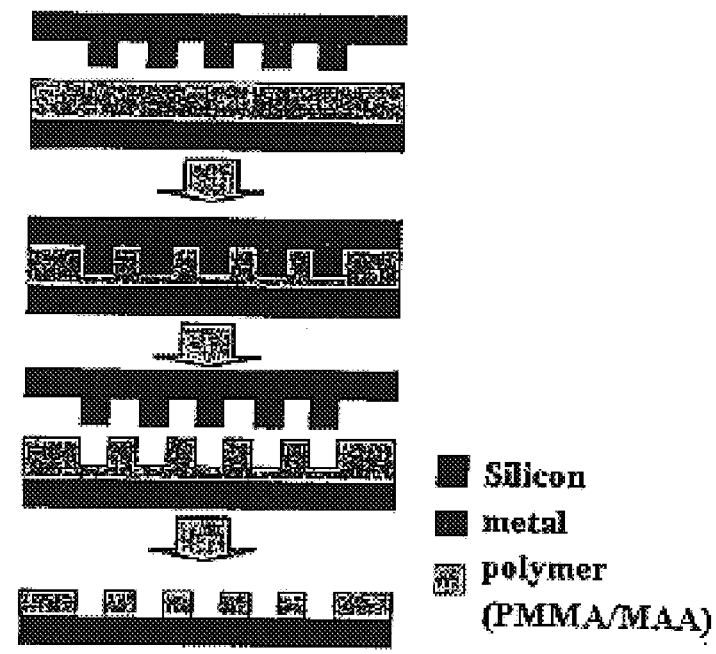
FIGS. 18A and 18B are views for schematically showing the process of nano imprint lithography for forming nanodots or nanowires in the method of horizontally growing carbon nanotubes according to the present invention.
Figure 18B:
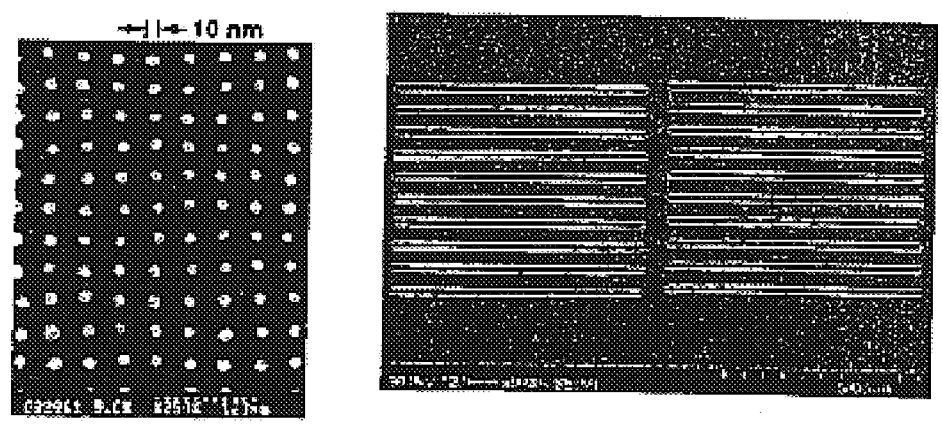

One of those methods is to utilize the process of nano imprint lithography as shown in FIGS. 18A and 18B. FIGS. 18A and 18B are views for schematically showing the process of nano imprint lithography for forming nanodots or nanowires in the method of horizontally growing carbon nanotubes according to the present invention.

The nano imprint lithography is an imprinting process, in which a stamp having a nano-pattern is pressed onto a high-molecular thin film, to form a high-molecular pattern in a size of nanometers, which can be applied to a large area wafer, as shown in FIGS. 18A and 18B. The nano imprint lithography is a process for simply fabricating a pattern having a size of several tens nanometers, which is largely simplified in comparison with a process of forming the large area nano-pattern by means of the existing fine optical processing technology.

Figure 19:
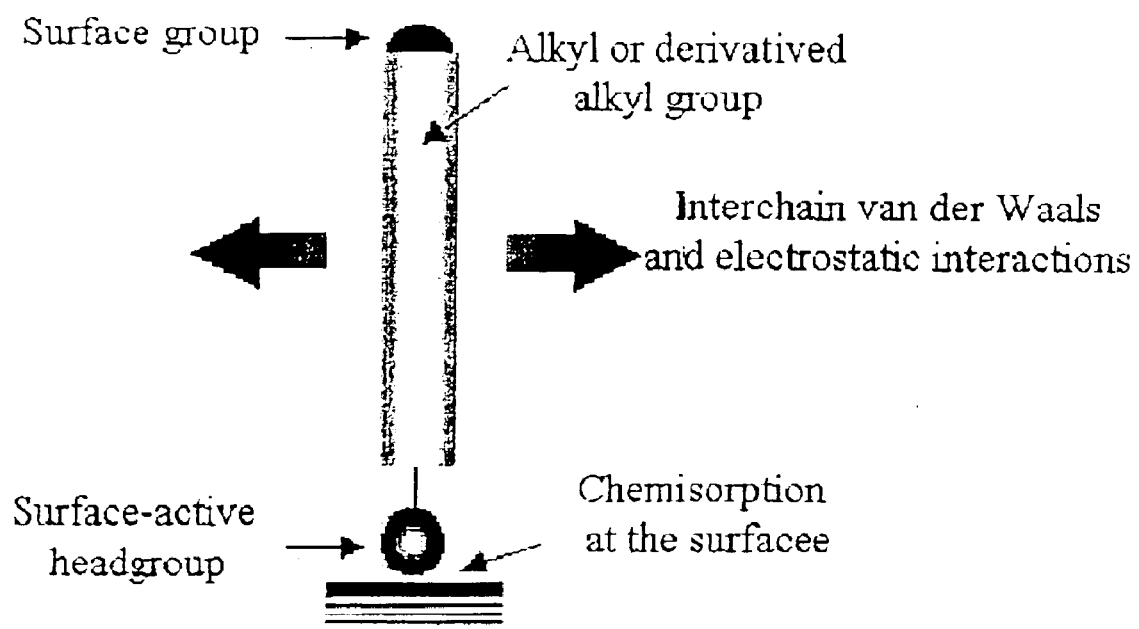
FIG. 19 is a view for schematically showing the self-assembly method for forming the nanodots or nanowires in the method of horizontally growing carbon nanotubes according to the present invention.

Further, the catalyst pattern of nanodots or nanowires can be formed by means of a self-assembly method as shown in FIG. 19, which is a view for schematically showing the self-assembly method for forming g the nanodots or nanowires in the method of horizontally growing carbon nanotubes according to the present invention.

In the self-assembly method as mentioned above, the upper surface of the substrate made from such metal as gold Au or silicon Si is coated with such a specific material capable of being adsorbed to the surface as surface-active headgroup, which are mostly organic molecules adsorbed in a mono-molecule layer, and then is coated with a material in alkyl group, which enables a connection to a material to be coated thereon. Thereafter, a material of surface group having the characteristic of film is coated hereon, so that an ultra fine thin film having various layers from a single layer to a plurality of layers can be fabricated.

That is, the specific material capable of being adsorbed to the substrate is applied, and a material functioning as a bridge to the material of thin film to be deposited are applied, and then the desired material of thin film is deposited. After the specific material capable of performing chemical adsorption is deposited on the surface, and then it is patterned by means of scanning tunneling microscope/atomic force microscope (STM/AFM), so that an ultra fine thin film having a desired pattern can be obtained.

Figure 20:
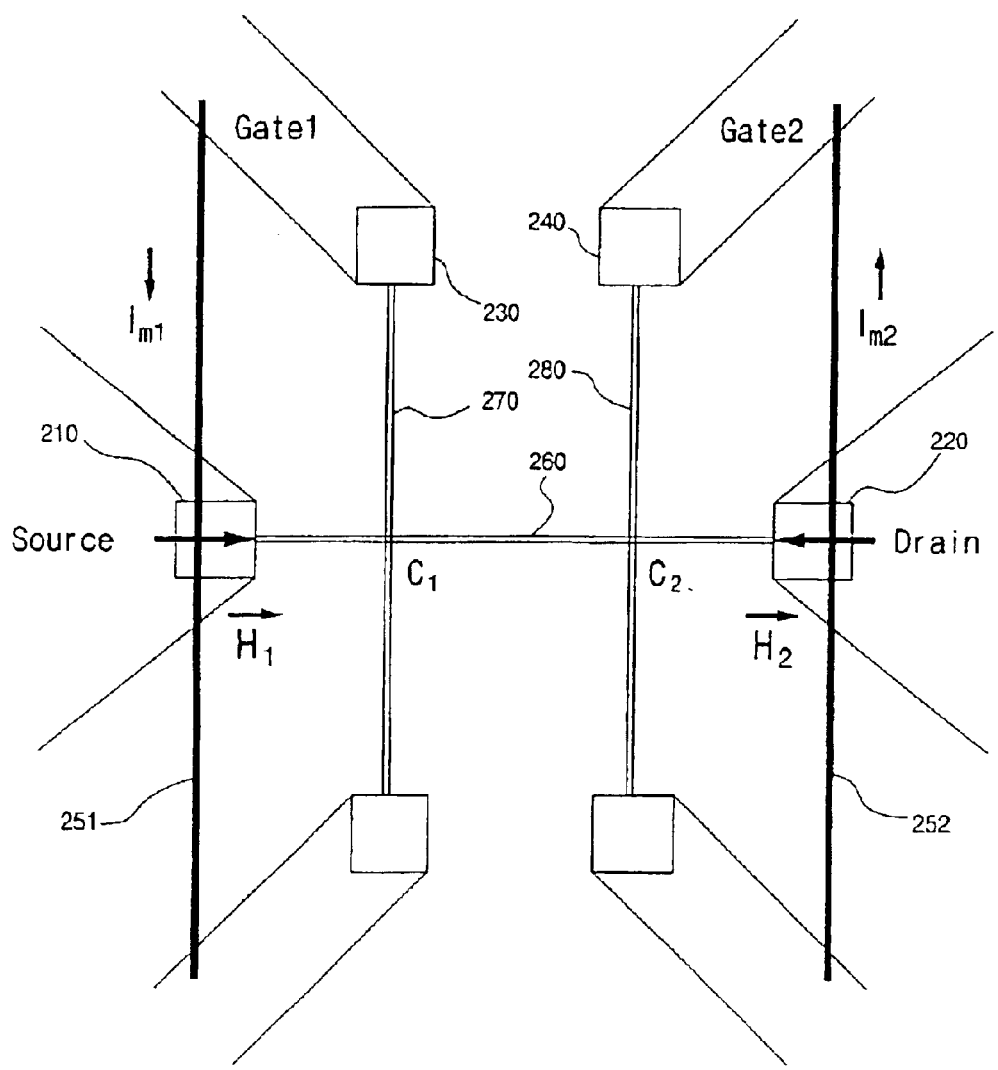
FIG. 20 is a view for schematically showing the construction of a spin valve single electron transistor utilizing the carbon nanotubes according to the present invention.
Figure 21:
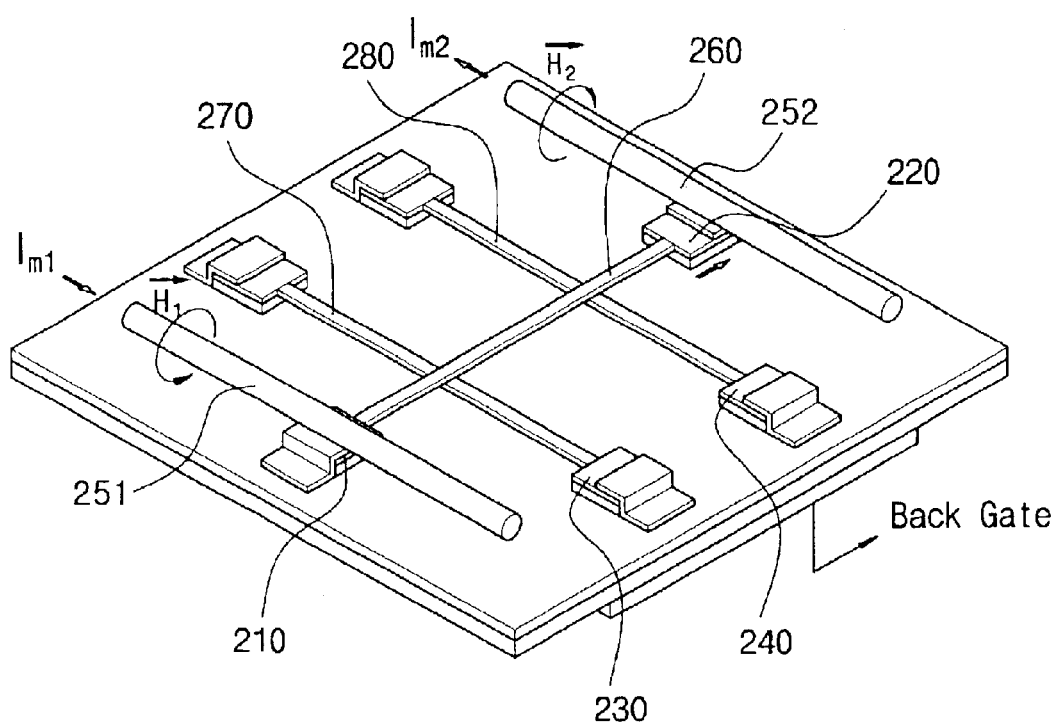
FIG. 21 is a perspective view of the spin valve single electron transistor according to the present invention as shown in FIG. 20.

In the meantime, FIG. 20 is a view for schematically showing the construction of a spin valve single electron transistor utilizing the carbon nanotubes according to the present invention, and FIG. 21 is a perspective view of the spin valve single electron transistor according to the present invention as shown in FIG. 20. The spin valve single electron transistor as follows can be obtained by utilizing the carbon nanotubes grown in the horizontal direction of the substrate by the method of horizontally growing carbon nanotubes as described above.

Referring to FIGS. 20 and 21, in the spin valve single electron transistor according to the present invention, the carbon nanotubes are grown in the horizontal direction between a source 210 and a drain 220 to form a carbon nanotube bridge 260, which enables the flow of the electric current by the unit of electron to be controlled. In this case, the carbon nanotube bridge 260 formed between the source 210 and the drain 220 consists of carbon nanotubes having the characteristic of semiconductor.

Further, the carbon nanotube bridge 260 formed between the source 210 and the drain 220 is formed on a plurality of gate carbon nanotubes 270 and 280, which are formed in such a manner as to produce an energy barrier to form a quantum point and to control the flow of the electric current.

Further, wires 251 and 252, through which electric current can pass, are provided on the source 210 and the drain 220, so as to magnetize the catalyst being in contact with the source 210 and the drain 220 in a desired direction.

Furthermore, the source wire 251 disposed on the source 210 and the drain wire 252 disposed on the drain 220 are arranged in parallel to each other.

Figure 22:
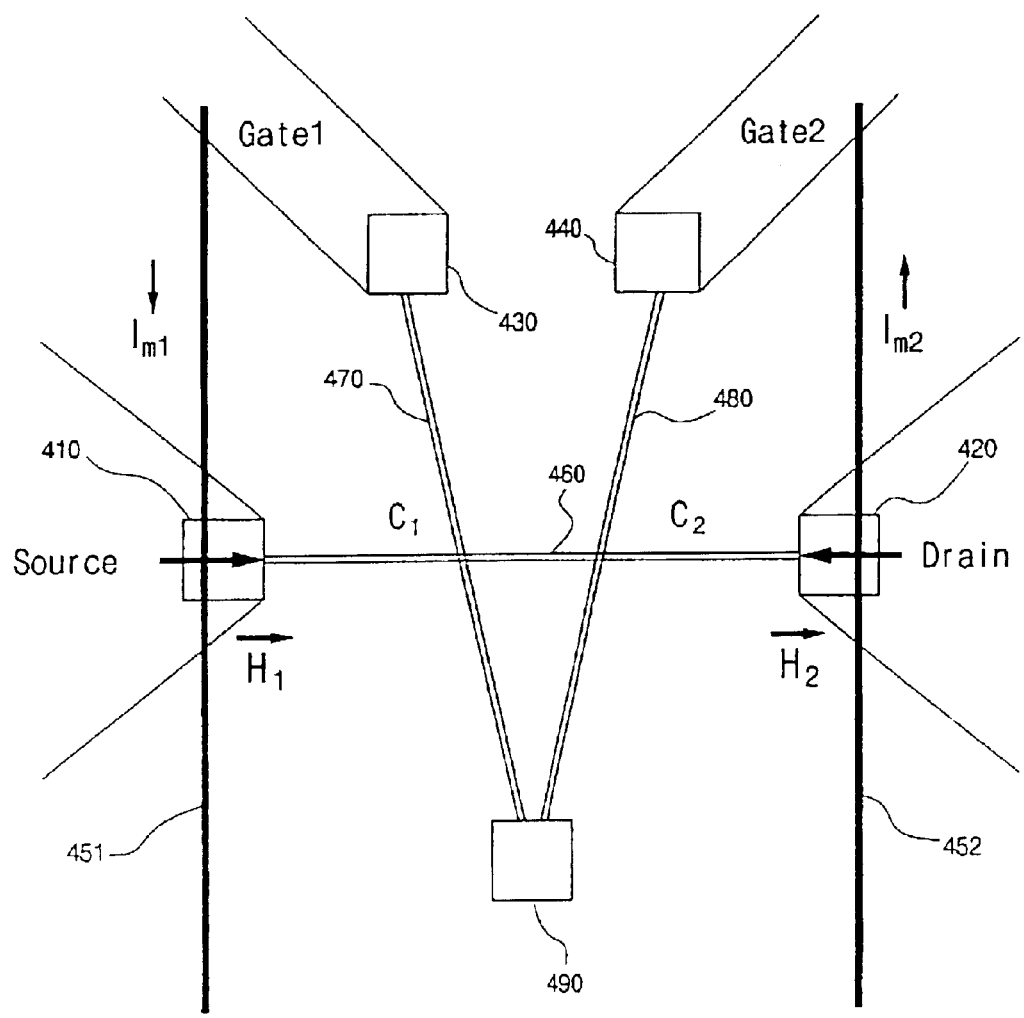
FIG. 22 is a view for schematically showing a spin valve single electron transistor according to another embodiment of the present invention.

Meanwhile, FIG. 22 is a view for schematically showing a spin valve single electron transistor according to another embodiment of the present invention.

Referring to FIG. 22, when a plurality of gate carbon nanotube bridges 470 and 480 form gates 430 and 440, the size of the quantum point is controlled by using a common terminal 490. Other elements in the: present embodiment are the same as those described with reference to FIGS. 20 and 21.

Hereinafter, the description will be on an operation of the spin valve single electron transistor utilizing carbon nanotubes according to the present invention, which has the construction as described above.

Referring to FIGS. 20 and 21, in the carbon nanotube bridge 260 of the semiconductor characteristic formed between the source 210 and the drain 220, a positive voltage is applied to the carbon nanotube bridges 270 and 280, which are respectively defined as first and second gates 230 and 240. Consequently, the electric charges may be insufficient in the points C1 and C2, which results in a formation of energy barriers at the points C1 and C2. In this case, in the case of the carbon nanotube bridge 260 between the source 210 and the drain 220, the portion between the points C1 and C2 is isolated from the surrounding forming the quantum point.

Further, since the electrodes of the source 210 and the drain 220 are in contact with the carbon nanotube bridge 260 through the transition metal catalyst, the catalyst being in contact with the source 210 and the drain 220 can be magnetized in a desired direction by transmitting electric currents defined as $I_{m1}$ and $I_{m2}$ in consideration of a proper coercive force.

By the method as described above, the spin of the electron injected into the source 210 can be controlled. In this case, the spin of the injected electron can be conserved when portions of the carbon nanotube bridge 260 between the source 210 and the point C1 and between the point C2 and the drain 220 are ballistic conductors.

Therefore, in the case where an electron makes an access by tunneling to the quantum point formed between the points C1 and C2, the tunneling is easily generated when the spin directions are the same while it is not easily generated when the spin directions are different from each other, according to the magnetized direction of the source 210 and the drain 220.

As described above, the spin-related single electron transistor can be obtained by controlling the electric current transmitting through the carbon nanotube bridge 260 for channels.

In the meantime, FIGS. 23 to 26 are views for schematically showing various field effect transistors formed by the method of horizontally growing carbon nanotubes according to the present invention. Referring to FIGS. 23 to 26, various constructions of the field effect transistors will be described hereinafter.

Figure 23:
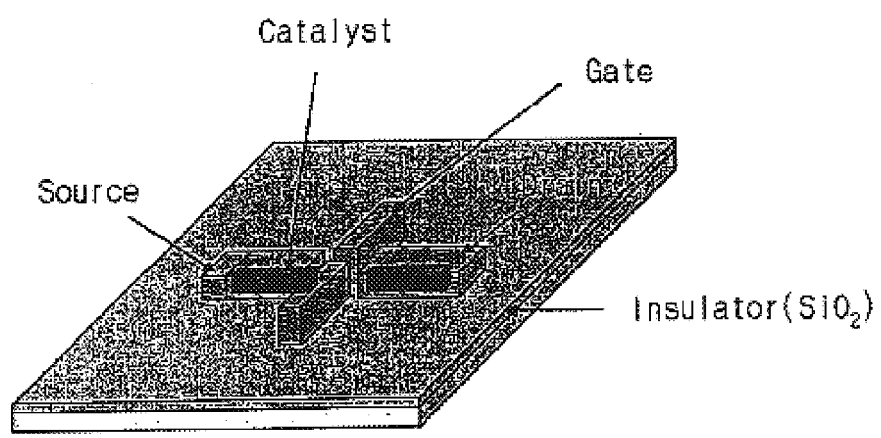
FIGS. 23 to 26 are views for schematically showing various field effect transistors formed by the method of horizontally growing carbon nanotubes according to the present invention.

FIG. 23 shows a field effect transistor, in which gates are disposed at both sides of the carbon nanotube. In this example, such metal as Niobium (Nb), Molybdenum (Mo) can be used as an electrode or an electrode layer for the growth preventing film. Further, a catalyst layer used as the catalyst is disposed under the electrode layers of source and drain. In this case, the same material as the catalyst pattern 12 described above can be used as the catalyst, and such materials as nickel (Ni), iron (Fe), and cobalt (Co) are usually used.

In this case, the gate electrodes are disposed at both sides of the source and the drain. Moreover, the carbon nanotube is synthesized between the gate electrodes by means of thermal chemical vapor deposition method (TCVD). Therefore, a geometrical design including the space between the gate electrodes is required, so that the carbon nanotube can be synthesized between the gate electrodes. In this case, it is preferred that the space between the gates is designed to have an elongated construction, that is, a long and narrow construction, so that the growth of the carbon nanotube is controlled while the electric field by the gates is sufficiently generated.

Figure 24:
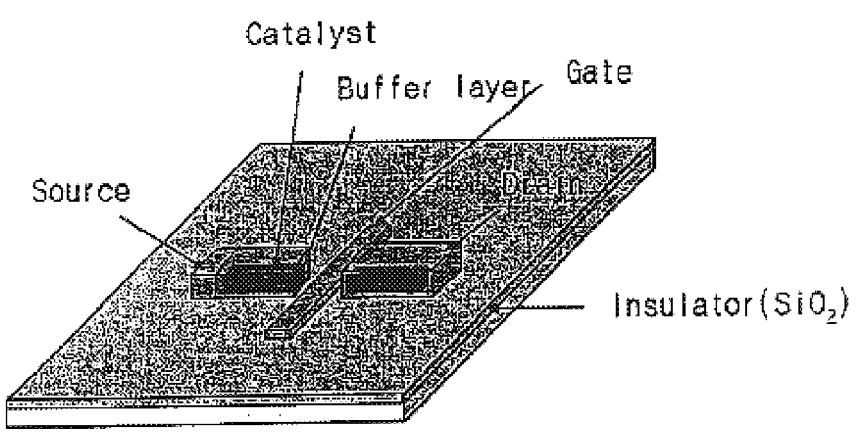

FIG. 24 shows a field effect transistor, in which the gate construction is located at the bottom. In this example, under the catalyst layer; is disposed a buffer layer for facilitating a height adjustment and an adhesion to an insulating layer of a wafer, since the height of the catalyst layer has to be larger than that of the gate.

Figure 25:
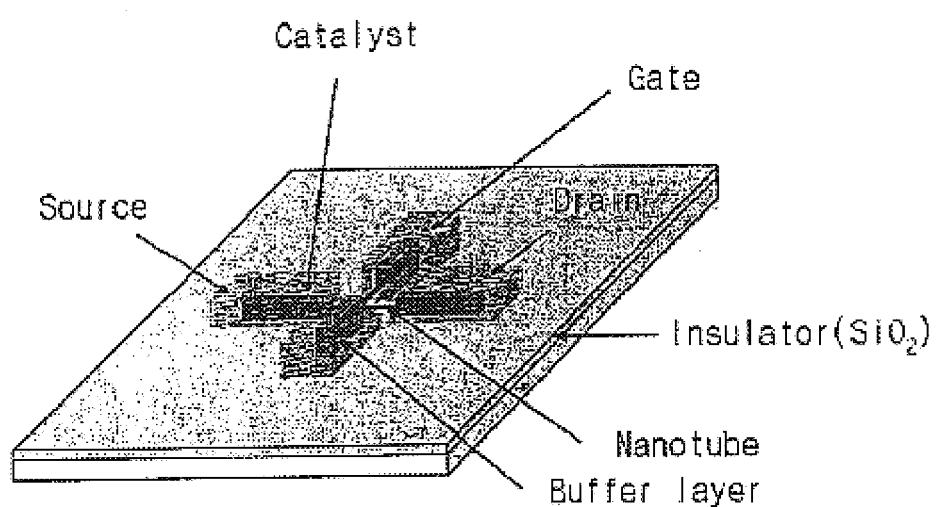
Figure 26:
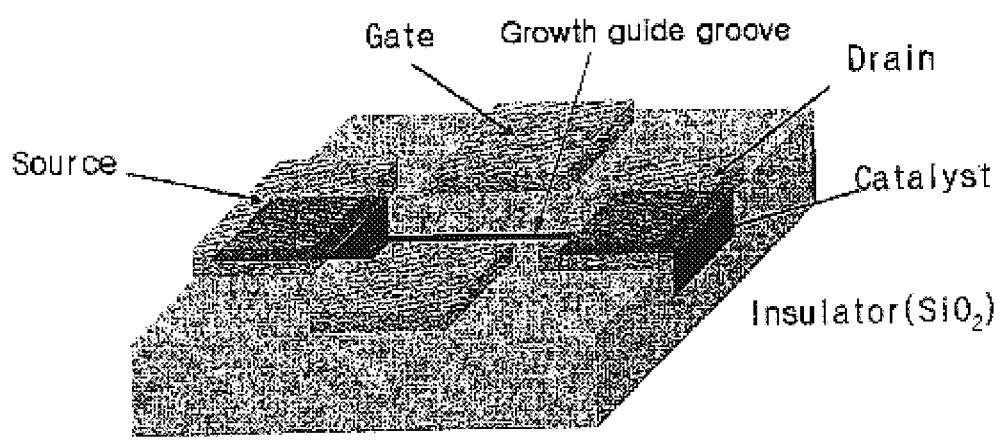

Further, the carbon nanotube may be warped by the electric field, since it has a good elasticity. In this case, the degree of the warp changes according to the kind and the length of the carbon nanotube. Although the maximum degree of the warp may be several tens nanometers, it is anticipated that the carbon nanotube is generally warped by several nanometers. Therefore, the construction shown in FIG. 23 is designed in such a manner as that the distance between the gates is larger than the width of the catalyst, on which the carbon nanotube is grown, by more than several tens nanometers. In the case of the ground gate shown in FIG. 24, a thin dielectric layer may be deposited on the gate electrode according to necessity. Meanwhile, FIG. 25 shows a construction, in which the carbon nanotubes are used as the gates.

In the meantime, when the carbon nanotube is synthesized, the carbon nanotube may grow vertically to the surface of the electrode, and it is very difficult to grow the carbon nanotube from the desired position to the opposed catalyst layer while the carbon nanotube has the semiconductor characteristic. In order to settle these problems, a path for functioning as a guide to lead the growth of the carbon nanotube, that is, a passage for the growth of the carbon nanotube, may be arranged between the catalyst layers, and the carbon nanotube may be grown in the path or the passage (see FIG. 26).

In this case, the guide for the growth of the carbon nanotube can be very precisely fabricated on the silicon oxide film by such a dry etching as a reactive ion etching (RIE). Then, catalyst is deposited on both ends of the guide, and then an electrode is deposited thereon. Also, the gates are disposed beside the guide. Further, the gates may be located on the surface of the dielectric as shown in the drawing, and the gate electrodes may be placed on etched areas like the catalyst layers, so that the gate electrodes can apply electric field at the same height as that of the catalyst layer or the carbon nanotube.

The constructions shown in FIGS. 23 and 24 can be fabricated through two times of lithography processes. However, the constructions shown in FIGS. 25 and 26 require three times of lithography processes. In this case, the construction shown in FIG. 25 can be fabricated not only as the field effect transistor (FET) but also as a tunneling transistor. Moreover, in the case where at least two carbon nanotubes are disposed as the gates, fabricated can be the Kondo element utilizing the Kondo resonance or the single electron transistor (SET) according to the gate-bias. In the construction shown in FIG. 26, the carbon nanotube is prevented from growing in an undesired direction when synthesized, so that the deject is reduced.

While there have been,illustrated and described what are considered to be preferred specific embodiments of the present invention, it will be understood by those skilled in the art that the present invention is not limited to the specific embodiments thereof, and various changes and modifications and equivalents may be substituted for elements thereof without departing from the true scope of the present invention.

What is claimed is:

1. A method of horizontally growing carbon nanotubes, comprising:
    (a) forming a predetermined catalyst pattern on a first substrate;
    (b) forming a vertical growth preventing layer on the first substrate, which prevents carbon nanotubes from growing in a vertical direction;
    (c) forming apertures through the vertical growth preventing layer and at least partially through the first substrate to expose surfaces of the catalyst pattern through the apertures; and
    (d) synthesizing carbon nanotubes at the exposed surfaces of the catalyst pattern to grow the carbon nanotubes in the horizontal direction.

2. A method as claimed in claim 1, wherein the formed apertures comprise a hole-type, in which the apertures extend entirely through the vertical growth preventing layer and the first substrate.

3. A method as claimed in claim 1, wherein the formed apertures comprise a well-type, in which the vertical growth preventing layer is entirely etched and the first substrate is partially etched, so that the apertures extend through the vertical growth preventing layer and a portion of the first substrate.

4. A method as claimed in claim 1, wherein the catalyst pattern has one from a straight-line shape, an intersection shape, a radial shape, a circular shape, and a rectangular shape, while the apertures are formed at intersecting areas of the catalyst pattern of a straight line shape, an intersection shape, and a radial shape, at an interior of a circle, and at an interior of a rectangle of the pattern.

5. A method as claimed in claim 4, wherein the carbon nanotubes formed respectively from the exposed surfaces of the catalyst pattern are grown to form a junction between them.

6. A method as claimed in claim 5, wherein the junction between the carbon nanotubes is formed by a phenomenon of thermal contraction of material which is generated in a cooling stage after the carbon nanotubes are grown.

7. A method as claimed in claim 4, wherein the carbon nanotubes formed from the exposed surfaces of the catalyst pattern interest each other.

8. A method as claimed in claim 1, wherein the grown carbon nanotubes form a bridge construction, by which exposed surfaces of the catalyst pattern opposing each other are connected with each other.

9. A method as claimed in claim 1, wherein the grown carbon nanotubes form a free-hang construction, in which the carbon nanotubes from the exposed surfaces of the catalyst pattern opposing each other are separated from each other.

10. A method as claimed in claim 1, wherein the grown carbon nanotubes are a plurality of carbon nanotubes grown at a single catalyst pattern.

11. A method as claimed in claim 1, wherein the grown carbon nanotubes form a mesh construction, in which a plurality of carbon nanotubes are grown from each of the exposed surfaces of catalyst pattern opposing each other, to be connected with each other.

12. A method as claimed in claim 1, further comprising patterning a metal, to intersect with at least one grown carbon nanotube so as to selectively form a junction between the at least one grown carbon nanotube and the metal at a specific location.

13. A method of horizontally growing carbon nanotubes, comprising:
    (i) forming masks at predetermined locations on a first substrate;
    (j) forming a catalyst pattern on the first substrate and the masks formed on the first substrate;
    k) forming a vertical growth preventing layer on the first substrate, which prevents the carbon nanotubes from growing in a vertical direction;
    (l) eliminating the masks from the vertical growth preventing layer and the first substrate to form apertures and expose surfaces of the catalyst pattern; and
    (m) synthesizing the carbon nanotubes at the exposed surfaces of the catalyst pattern to grow the carbon nanotubes in the horizontal direction.

14. A method as claimed in claim 13, wherein the catalyst pattern has one from a straight line shape, an intersection shape, a radial shape, a circular shape, and a rectangular shape, while the apertures are formed at intersecting areas of the catalyst pattern of a straight line shape, an intersection shape, and a radial shape, at an interior of a circle, and at an interior of a rectangular of the pattern.

15. A method as claimed in claim 14, wherein the carbon nanotubes formed respectively from the exposed surfaces of the catalyst pattern are grown to form a junction between them.

16. A method as claimed in claim 14, wherein the carbon nanotubes formed respectively from the exposed surfaces of the catalyst pattern intersect each other.

17. A method as claimed in claim 13, wherein the grown carbon nanotubes form a bridge construction, by which exposed surfaces of the catalyst pattern opposing each other are connected with each other.

18. A method as claimed in claim 13, wherein the grown carbon nanotubes form a free-hang construction, in which the carbon nanotubes from the exposed surfaces of the catalyst pattern opposing each other are separated from each other.

19. A method as claimed in claim 13, further comprising patterning a metal to intersect with at least one grown carbon nanotube to selectively form a junction between the at least one carbon nanotube and the metal at a specific location.

20. A method of horizontally growing carbon nanotubes, comprising:
    forming a catalyst pattern in a predetermined two-dimensional arrangement on a first substrate;
    fabricating a second substrate for preventing vertical growth of the carbon nanotubes and having holes in a predetermined arrangement;
    placing the second substrate: for preventing vertical growth of the carbon nanotubes over the first substrate having the catalyst pattern with a predetermined gap; and
    synthesizing the carbon nanotubes at the catalyst pattern, so as to horizontally grow the nanotubes.

21. A method of horizontally growing carbon nanotubes, comprising:

forming a catalyst in a shape of nanodots or nanowires on a substrate;

patterning a growth preventing layer on the catalyst so as to prevent the nanodots or nanowires from growing in a vertical direction; and selectively growing the carbon nanotubes in a horizontal direction at the nanodots or nanowires.

22. A method as claimed in claim 21, wherein the catalyst are patterned by an imprint method.

23. A method as claimed in claim 21, wherein the catalyst are patterned by a self-assembly method.

24. A method as claimed in claim 21, wherein the growth preventing layer includes an insulator film made from a compound selected from the group consisting of silicon nitride (SiN) and silicon oxide ($SiO_2$).

25. A method as claimed in claim 21, wherein the growth preventing layer includes a method selected from the group consisting of Palladium (Pd), Niobium (Nb), and Molybdenum (Mo).

26. A method of horizontally growing carbon nanotubes, comprising:

forming catalysts in a shape of nanowires on a substrate;

forming a growth preventing layer on the catalysts by a semiconductor process including a lithography process, the growth preventing layer being spaced from the substrate a predetermined gap;

eliminating a portion of the catalysts in an area at which the growth preventing layer is not formed by of a wet etching method; and growing the carbon nanotubes in a horizontal direction between the catalysts formed under the growth preventing layer, by a chemical vapor deposition method.

27. A method as claimed in claim 26, wherein the catalyst are patterned by an imprint method.

28. A method as claimed in claim 26, wherein the catalyst are patterned by a self-assembly method.

* * * * *